(12) United States Patent
Overstolz et al.

(10) Patent No.: US 9,461,659 B2
(45) Date of Patent: Oct. 4, 2016

(54) MICRO-MACHINED VAPOR CELL

(71) Applicant: CSEM Centre Suisse d'Electronique et de Microtechnique SA—Recherche et Développement, Neuchâtel (CH)

(72) Inventors: Thomas Overstolz, Saint-Blaise (CH); Jacques Haesler, Lugnorre (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 0 days.

(21) Appl. No.: 14/604,581

(22) Filed: Jan. 23, 2015

(65) Prior Publication Data

US 2016/0218726 A1    Jul. 28, 2016

(51) Int. Cl.
*H03L 7/26* (2006.01)
*G04F 5/14* (2006.01)

(52) U.S. Cl.
CPC .. *H03L 7/26* (2013.01); *G04F 5/14* (2013.01)

(58) Field of Classification Search
CPC .................................. H03L 7/26; G04F 5/14

USPC ..................................................... 331/3, 94.1
See application file for complete search history.

(56) References Cited

U.S. PATENT DOCUMENTS

2010/0033256 A1*  2/2010  Strabley .................... G04F 5/14
                                                                  331/94.1

OTHER PUBLICATIONS

Liew, et al., "Microfabricated alkali atom vapor cells". Applied Physics Letters, vol. 84., No. 19, Apr. 5, 2004.

* cited by examiner

*Primary Examiner* — Arnold Kinkead
(74) *Attorney, Agent, or Firm* — Koppel, Patrick, Heybl & Philpott

(57) ABSTRACT

The invention concerns a micro-machined vapor cell comprising a central silicon element forming a cavity containing vapor cell reactants such as alkali metal or alkali metal azide, buffer gas(es), and/or anti relaxation coating(s); a first and a second glass caps sealing the cavity; and a solenoid arranged to provide a homogeneous magnetic field to said vapor cell. The solenoid is coiled directly on the central silicon element of the vapor cell. This invention is an improvement for the highly miniaturized atomic clocks developments.

10 Claims, 3 Drawing Sheets

MICRO-MACHINED VAPOR CELL

TECHNICAL FIELD

The invention relates to highly miniaturized atomic clocks. The invention particularly concerns micro-machined chip-sized vapor cells with volumes on the order of a few cubic millimeters or less. The invention also concerns a method to fabricate the aforementioned vapor cells.

BACKGROUND OF THE INVENTION

Miniaturized atomic clocks characterized by a small size and a drastically reduced power consumption compared to standard atomic clocks exhibit an increasing interest mainly for applications in portable devices. The unprecedented frequency stability of atomic clocks is achieved by a suitable interrogation of optically excited atoms in order to achieve the hyperfine splitting of the electron state of the reactant, which takes place in the so-called vapor cell, the heart of an atomic clock. The vapor cell comprises a sealed cavity, which contains small amounts of suitable reactants: an alkali metal, preferably rubidium or cesium, buffer gas(es), and/or anti-relaxation coating(s).

MEMS technology allows for fabricating miniaturized vapor cells having a volume in the range of a few cubic millimeters. Silicon micromachining is particularly interesting. It allows a very high level of miniaturization and hybrid integration with control electronics and sensors, and the wafer-level batch fabrication affords a low cost production and higher reproducibility.

Various atom excitation techniques have been investigated concerning the field of miniaturized atomic clocks developments. One alternative includes coherent population trapping (CPT) by means of a modulated laser, while another alternative is based on double-resonance (DR) microwave excitation by means of a modulated magnetic field.

In most vapor cell frequency references, which do not use CPT or DR, the minimum size of the clock physics package is determined in part by the cavity that confines the microwaves used to excite the atoms. This cavity is usually larger than one-half the wavelength of the microwave radiation used to excite the atomic resonance. For cesium and rubidium, this wavelength is of the order of several centimeters, clearly posing a problem for the development of vapor cell references for portable applications. Thus, CPT or DR excitation is very suitable for micro-machined vapor cells.

Indeed, L-A Liew, Appl. Phys. Lett. 84, 2694 (2004) discloses a method to fabricate millimeter sized cesium vapor cells using silicon micromachining and anodic bonding techniques, where the frequency reference is based on optical excitation and CPT interrogation. The results presented in this work show that it is possible to design and build frequency references far smaller than known in the prior art before even if it results in a complicated interrogation optics assembly highlighted by the miniaturization conditions.

In addition, in order to realize a working CPT or DR atomic clock a magnetic field has to be provided which is required to be homogeneous inside the vapor cell in order to achieve ground-state hyperfine splitting of the alkali atoms.

There are different ways to create the needed homogeneous magnetic field.

One option is the use of permanent magnets, but they present the disadvantage that the strength of the magnetic field cannot be adjusted, and that they make the final device quite bulky.

On the other hand, electromagnets could be used for achieving a proper homogeneous magnetic field. Helmholtz configuration with two planar coils integrated directly on the two windows of the vapor cell may be a suitable option. However, the Helmholtz condition $r=d$ (where r is the radius of the coil and d is the distance between the two coils) must be fulfilled in order to obtain a homogeneous magnetic field, a requirement which limits downsizing of the vapor cells. Moreover, planar coils realized in MEMS technology are characterized by a very low thickness of the coil, typically in the range of some hundreds of nanometer. As a consequence, a planar coil has a relatively high electrical resistance and hence an elevated power dissipation. Thus, a skilled person is not encouraged to investigate planar coils for providing a homogeneous magnetic field in a miniaturized vapor cell.

The object of this invention is to at least partially overcome the limitations described, and thereby provide a versatile simple configuration using electromagnets to create the needed homogeneous magnetic field on the vapor cell boosting the methods of miniaturization and providing a favorable simplicity to efficiency ratio.

SUMMARY OF THE INVENTION

To this end, the invention relates to a micro-machined vapor cell comprising a central silicon element forming a cavity containing vapor cell reactants, like an alkali metal or alkali metal azide, buffer gas(es), and/or anti relaxation coating(s). It comprises a first and a second glass caps sealing the central silicon element. It also comprises a solenoid arranged to provide a homogeneous magnetic field to said vapor cell. The micro-machined vapor cell is characterized in that the solenoid is coiled directly on the central silicon element of the vapor cell, which forms the core of the solenoid.

Such a vapor cell presents the advantage that the magnetic means don't add significant additional volume. Another advantage of this solution is its very low electrical resistivity compared to a planar coil realized in MEMS technology.

Thus, the object of the invention contributes to the development of highly miniaturized atomic clocks using simple configurations in order to simplify and to improve the control of the assembled components.

The invention also concerns a method to fabricate the aforementioned vapor cell comprising the steps of:
supplying a silicon wafer; etching a first hole-pattern and a second hole-pattern through said silicon wafer to form holes constituting the cavities;
anodic bonding a first glass wafer on the bottom of the etched silicon wafer to form a first cap;
filling the holes with vapor cell reactants such as alkali metal or alkali metal azide, buffer gas(es), and/or anti relaxation coating(s);
anodic bonding a second glass wafer on the top of the etched silicon wafer to form a second cap, a bonded wafer stack being obtained;
dicing said bonded wafer stack along lines defined by the shape of the second hole-pattern; and finally, and
coiling a solenoid directly on the central silicon element of said vapor cell.

Further characteristics and details of this invention are explained in the following detailed description of the invention and in the claims.

BRIEF DESCRIPTION OF THE DRAWINGS

The above described objects and advantages of the present invention will become more readily apparent to those ordinarily skilled in the art after reviewing the following detailed descriptions and accompanying drawings, in which.

DETAILED DESCRIPTION

Figure 1:
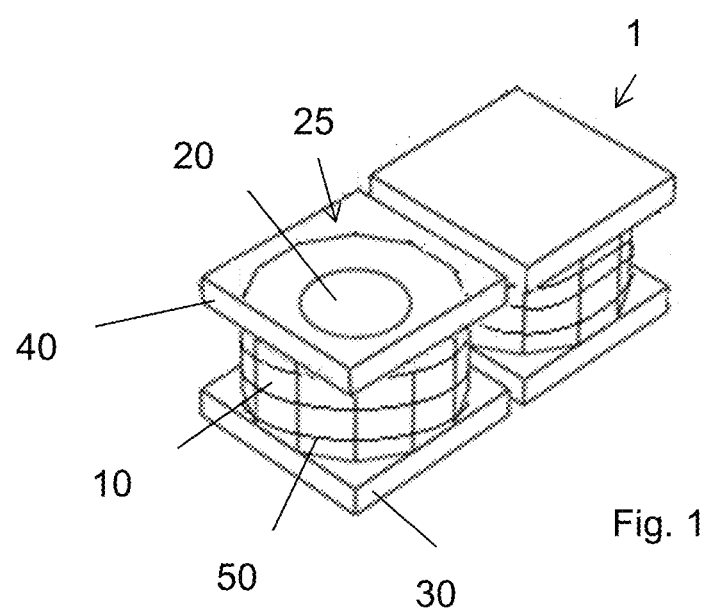
FIG. 1 illustrates a vapor cell according to the invention.

FIG. 1 shows a micro-machined vapor cell 1 according to the invention comprising:
- a central silicon element 10 forming a cavity 20 containing vapor cell reactants such as alkali metal or alkali metal azide, buffer gas(es), and/or anti relaxation coating(s); and
- a first 30 and a second 40 glass caps sealing the cavity 20.

The cavity is preferably cylindrical but other shapes can be obviously used.

The present invention being not particularly directed to the reactants suitable for obtaining a vapor cell, this aspect will not be described in details and the scope of the protection is not limited by the example provided. The skilled person will be able to adapt this disclosure on the basis of its knowledge.

The vapor cell 1 comprises furthermore a solenoid 50 arranged to provide a homogeneous magnetic field to said vapor cell 1. According to the invention, the solenoid 50 is coiled directly on the vapor cell 1 that defines the core of this solenoid 50. More precisely, the wire forming the solenoid is coiled along the longitudinal axis of the cavity, along the external surface 25 of the central silicon element 10. The solenoid provides a homogeneous magnetic field to the vapor cell 1 with the advantage that not significant additional volume is added to the vapor cell 1, achieving an important goal of the invention.

FIG. 1 presents two identical enlarged vapor cells 1, one of them showing through its upper sealing cap 40 the central silicon element 10, the cavity 20 being visible. The different components of the vapor cell 1, the two glass caps 30 and 40 and the external surface 25 of the central silicon element 10, are arranged to keep the solenoid 50 in a substantially fixed, at least stable, position without the risk that it glides off. Essentially, the solenoid 50 has to be maintained between the two caps 30 and 40 that define banking means for the solenoid 50.

In the example presented here, the central silicon element 10 has a dodecagonal shaped external surface 25 while the two glass caps 30 and 40, closing the cavity 20, have a quadratic shape with the particularity that they define limitation means for the solenoid 50 and that they exceed the footprint of the central silicon element 10, defined by its external surface. In other examples, different cap shapes could also be used as an ellipse or a regular polygon. Other banking means may be considered, in addition to the sealing means. Hooks or notches can be considered, extending over the footprint of the central silicon element 10. Nevertheless, the quadratic shape of the caps 30 and 40 simplifies the fabrication process of the vapor cells 1 according to the invention as it is going to be described further.

The external surface 25 of the central silicon element 10 has preferably a regular polygonal shape, which could be an octagonal shape, but also a dodecagonal shape as said before, or a hexadecagonal shape, or any regular polygonal shapes having (n*4) number of segments, where n is an integer and it is equal or greater than 2.

The different shapes of the glass caps 30 and 40 and the external surface 25 of the central silicon element 10 are obtained in the fabrication method by a combination of etching and dicing processes.

Figure 2:
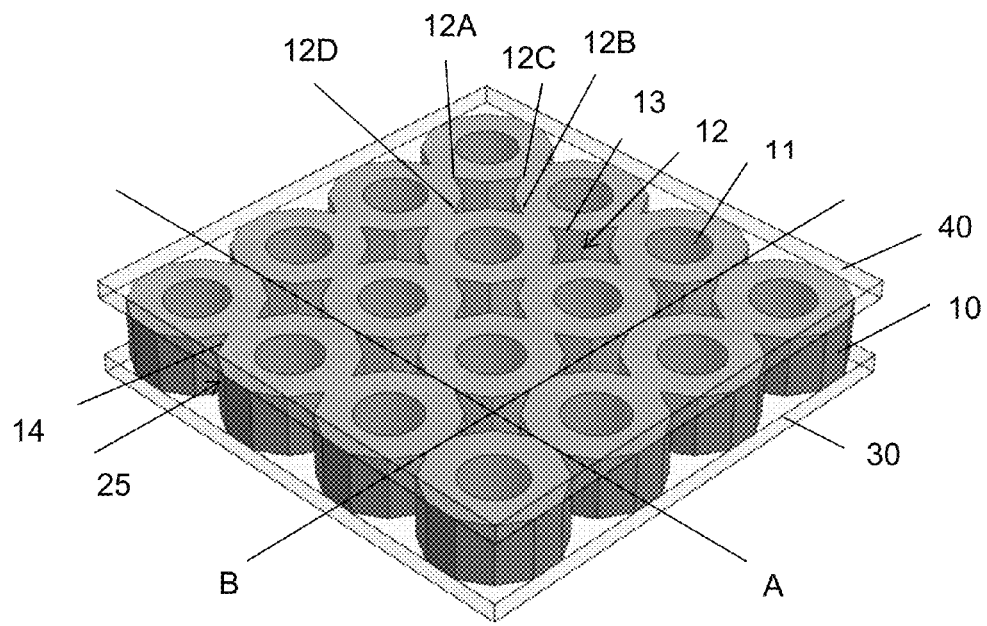
FIGS. 2 and 3 illustrate different aspects of the method of vapor cell's fabrication according to the invention.
Figure 3:
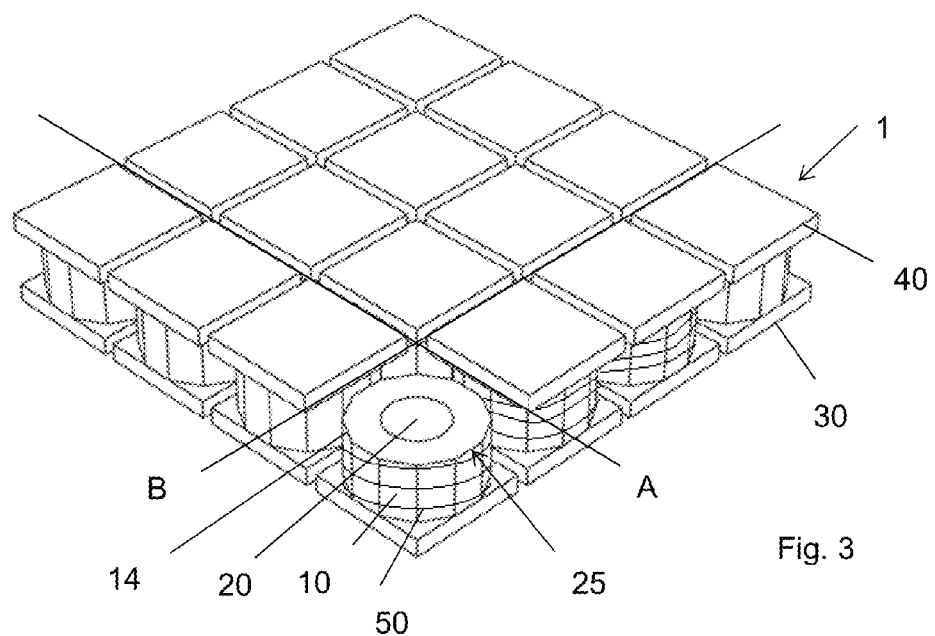

The method to fabricate the described vapor cell 1 according to the invention is principally illustrated using FIGS. 2 and 3.

In this example, FIG. 2 presents two different patterns of holes 11 and 12 that are etched through a silicon wafer. The first hole-pattern 11 consists of circular holes required for the vapor cell cavities 20 that are arranged in regularly spaced columns and rows. The second hole-pattern 12 consists of holes having a star shape. The figure shows that this star shape is formed by four peaks 12A, 12B, 12C and 12D, each peak being arranged perpendicularly in reference to its two adjacent peaks. The second hole-pattern 12 is offset towards the first hole-pattern 11 by half the column spacing and half the row spacing. In this figure a silicon wafer square matrix is presented showing sixteen first circular hole-patterns 11 and nine second hole-patterns 12; this is going turn out that sixteen singular vapor cells 1 are going to be formed following the method of fabrication illustrated in this non limiting example.

Figure 4:
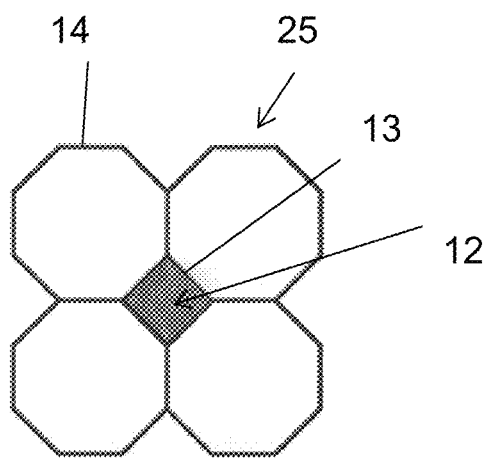
FIGS. 4 to 6 illustrate different regular polygonal shapes of the external surface of the central silicon element etched through the silicon wafer, and different shapes of the second hole-pattern also etched trough the silicon wafer.
Figure 5:
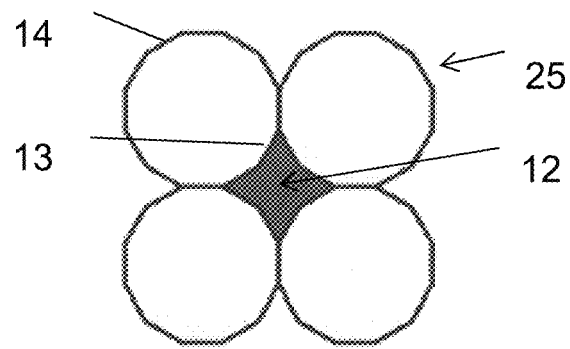
Figure 6:
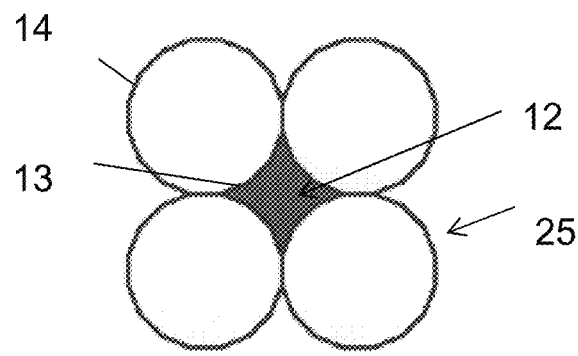

The shape of the second hole-pattern 12 is chosen in function of the desired external surface 25 shape of the central silicon element 10, as illustrated in FIG. 4 to FIG. 6. For example, FIG. 4 illustrates a second hole-pattern 12 showing the shape of a four-peaks star, in this case the four-peaks star is a rhombus (square), and it is formed by four adjacent octagons formed by eight external surface segments 14 that represent the external surface 25 shape of the central silicon element 10. In another example illustrated in FIG. 5, the four-peaks star has eight peak star segments 13 and it is formed by four adjacent dodecagons formed by twelve external surface segments 14; and in that way, FIG. 6 illustrates a four-peaks star having twelve peak star segments 13 and it is formed by four adjacent hexadecagons formed by sixteen external surface segments 14. By adding more and more segments 14 to the regular polygonal central silicon element 10, the four-peaks star gets more and more segments 13 too. Thus, the four-peaks stars are formed by a number of (m*4) segments 13, where m is an integer, equal to or greater than 1 and depending on the desired regular polygonal shape of the central silicon element external surface 25.

We note that n and m tending to infinity, the external shape of the central silicon elements 10 tend to a circular shape.

The peak star segments 13 plays an important role in the dicing process following the method presented hereafter. Thus, two lines A and B define the dicing directions. These lines A and B intersect perpendicularly in the center of the second hole-pattern 12 (the four-peak star shape), each line connecting opposite peaks of the star. Line A connects two peaks of the star 12A and 12B, and line B connects the other two peaks of the star 12C and 12D. All the second hole-patterns 12 are identical, so, the definition of the lines A and B could be defined by any one of the second hole-patterns 12.

It should be noticed that when etching the second hole-pattern 12, all segments 14 of the regular polygonal external surface 25 of the central silicon element 10 are formed up, except the segments 14 that relies the different central silicon elements 10, that is the two adjacent segments 14 crossed by the line A and the two adjacent segments 14 crossed by the line B, that is where the future vapor cells 1 are still connected to their direct neighbors (attaches) before dicing process.

Although the silicon wafer has many holes, the wafer is still stable and can be easily manipulated. The next fabrication steps are the anodic bonding of a first glass wafer to one side of the silicon wafer (the bottom side of the etched silicon wafer) to form a first cap 30 to seal it. After, the filling of the cavities 20 with the required reactants, such as an alkali metal or an alkali metal azide. Then the bonding of a second glass wafer to the other side of the silicon wafer (the top side of the etched silicon wafer) also to form a second cap 40 to seal it, preferably under controlled atmosphere. Then, the bonded wafer stack is diced along the lines A and B defined by the shape of the second hole-pattern 12. Finally, the result is shown in FIG. 3 where the vapor cell matrix is clearly visible after the dicing process; sixteen singular vapor cells 1 were fabricated following the method according to the invention. The sealing cap 40 of one of the central silicon elements 10 is not represented to show the components between the layers of the bonded wafer stacks.

The solenoid 50 is then coiled directly on the central silicon element 10, the first 30 and second 40 glass caps defining banking means to keep it in a substantially fixed position without the risk that it glides off.

It is therefore obtained a micro-machined vapor cell 1 equipped with a solenoid 50 that provides the needed homogeneous magnetic field in order to achieve ground-state hyperfine splitting of the alkali atoms. Thanks to this configuration and to the above-described process, the volume of the vapor cell 1 is lower than 100 mm$^3$, preferably even less than 1 mm$^3$.

Some exemplary embodiments of a micro-machined vapor cell and methods for making a micro-machined vapor cell are described according the following non-exclusive examples:

Example 1

A micro-machined vapor cell comprises:
a central silicon element forming a cavity containing vapor cell reactants such as alkali metal or alkali metal azide, buffer gas(es), and/or anti relaxation coating(s),
a first and a second glass caps sealing the cavity, and
a solenoid arranged to provide a homogeneous magnetic field to said vapor cell,
characterized in that the solenoid is coiled directly on the central silicon element, which forms the core of the solenoid.

Example 2

The micro-machined vapor cell according to example 1, characterized in that the first and second glass caps define banking means to keep the solenoid coiled on the central silicon element.

Example 3

The micro-machined vapor cell according to example 2, characterized in that the first and second glass caps exceed the central silicon element.

Example 4

The micro-machined vapor cell according to any one of examples 2 and 3, characterized in that the central silicon element shows an external surface having a regular polygonal shape.

Example 5

The micro-machined vapor cell according to example 4, characterized in that the regular polygonal shape external surface of the central silicon element is an octagon, a dodecagon, a hexadecagon, and all regular polygonal shapes having a number of (n*4) segments, where n is an integer equal or greater than 2.

Example 6

The micro-machined vapor cell according to any one of examples 1 to 5, characterized in that the vapor cell volume is lower than 100 mm$^3$.

Example 7

Method to fabricate the micro-machined vapor cell according to any one of the previous examples and comprising the following steps:
providing a silicon wafer,
etching a first hole-pattern and a second hole-pattern through said silicon wafer to form holes constituting cavities,
anodic bonding a first glass wafer on the bottom of the etched silicon wafer to form a first cap,
filling the holes with vapor cell reactants such as alkali metal or alkali metal azide, buffer gas(es), and/or anti relaxation coating(s),
anodic bonding a second glass wafer on the top of the etched silicon wafer to form a second cap, a bonded wafer stack being obtained,
dicing said bonded wafer stack along lines (A and B) defined by the shape of the second hole-pattern, and
coiling a solenoid directly on the central silicon element.

Example 8

The method according to example 7, characterized in that the first hole-pattern and the second hole-pattern are arranged in regular columns and rows through the silicon wafer.

Example 9

The method according to any one of examples 7 and 8, characterized in that the shape of the second hole-pattern is a four-peak star.

Example 10

The method according to example 9, characterized in that the four-peaks stars are formed by (m*4) segments, where m is an integer equal to or greater than 1 and depends of the desired regular polygonal shape external surface of the central silicon element.

Example 11

The method according to any one of examples 9 to 10, characterized in that the dicing process follows two perpendicular lines (A and B) that cross in the center of the second hole-pattern, each line connecting opposite peaks of the star.

We claim:

1. Micro-machined vapor cell comprising:
    a central silicon element forming a cavity containing vapor cell reactants such as alkali metal or alkali metal azide, buffer gas(es), and/or anti relaxation coating(s);
    first and second glass caps sealing the cavity; and
    a solenoid arranged to provide a homogeneous magnetic field to said vapor cell,
    characterized in that the solenoid is coiled directly on said central silicon element, which forms the core of the solenoid, wherein said first and second glass caps define banking means to keep said solenoid coiled on said central silicon element.

2. The micro-machined vapor cell according to claim 1, characterized in that the first and second glass caps exceed the central silicon element.

3. The micro-machined vapor cell according to claim 1, characterized in that the central silicon element comprises an external surface having a regular polygonal shape.

4. The micro-machined vapor cell according to claim 3, characterized in that the external surface of the central silicon element is an octagon, a dodecagon, a hexadecagon, or a regular polygonal shape having a number of (n*4) segments, where n is an integer equal to or greater than 2.

5. The micro-machined vapor cell according to claim 1, characterized in that the vapor cell volume is lower than 100 mm$^3$.

6. Method of fabricating a micro-machined vapor cell comprising the following steps:
    providing a silicon wafer;
    etching a first hole-pattern and a second hole-pattern through said silicon wafer to form holes constituting cavities and at least one central silicon element;
    anodic bonding a first glass wafer on the bottom of the etched silicon wafer to form a first cap, said first cap defining banking means;
    filling the holes with vapor cell reactants such as alkali metal or alkali metal azide, buffer gas(es), and/or anti relaxation coating(s);
    anodic bonding a second glass wafer on the top of the etched silicon wafer to form a second cap, a bonded wafer stack being obtained, said second cap defining banking means;
    dicing said bonded wafer stack along lines (A and B) defined by the shape of the second hole-pattern; and
    coiling a solenoid directly on the at least one central silicon element.

7. The method according to claim 6, characterized in that the first hole-pattern and the second hole-pattern are arranged in regular columns and rows through the silicon wafer.

8. The method according to claim 6, characterized in that the shape of the second hole-pattern is a four-peak star.

9. The method according to claim 6, characterized in that the shape of the second hole-pattern is formed by (m*4) segments, where m is an integer equal to or greater than 1 and is related to a number of external surfaces of one of said at least one central silicon element.

10. The method according to claim 8, characterized in that the dicing process follows two perpendicular lines (A and B) that cross in the center of the second hole-pattern, each line running through opposite peaks of the star.

* * * * *